United States Patent [19]

Laymoun et al.

[11] Patent Number: 4,745,580
[45] Date of Patent: May 17, 1988

[54] VARIABLE CLAMPED MEMORY CELL

[76] Inventors: Samir M. Laymoun, 655 Princeton Dr., Sunnyvale, Calif. 94087; Roger V. Rufford, 1415 Roosevelt Ave., Redwood City, Calif. 95061

[21] Appl. No.: 872,292
[22] Filed: Jun. 9, 1986
[51] Int. Cl.$^4$ ............................................. G11C 11/34
[52] U.S. Cl. ..................................... 365/179; 365/155
[58] Field of Search ............... 365/155, 179, 174, 189, 365/203

[56] References Cited

U.S. PATENT DOCUMENTS 4,488,268 12/1984 Toyoda ................................ 365/203

*Primary Examiner*—Joseph A. Popek
*Attorney, Agent, or Firm*—Townsend & Townsend

[57] ABSTRACT

An improved memory cell circuit in which the collector of the "ON" transistor is clamped to a variable voltage level to prevent saturation. Saturation is prevented by providing a mechanism for limiting the voltage between a first node in the word line circuit and the collector of the conducting transistor to a first level, while limiting the voltage between the first node and the collector of the nonconducting transistor to a second, lower level.

In one embodiment, clamping transistors have their emitters coupled to the collectors of the memory cell transistors and their bases coupled to the word line. A common resistor couples the load resistors of a plurality of memory cells to the word line.

In a second embodiment, the common resistor couples the bases of the clamping transistors to an intermediate node in a Darlington driver for the word line.

13 Claims, 2 Drawing Sheets

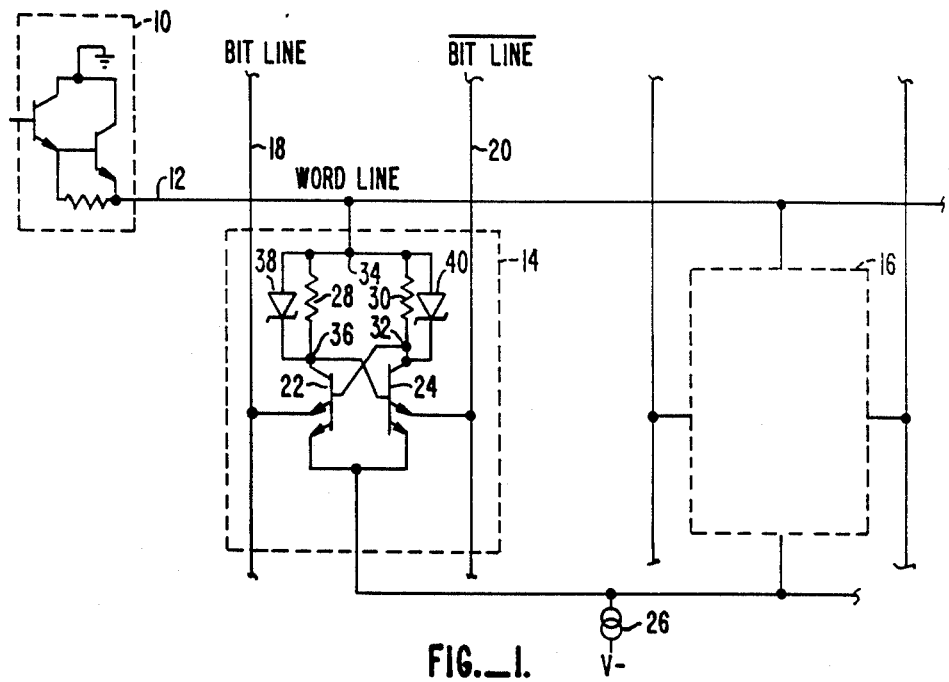
FIG._1.
PRIOR ART
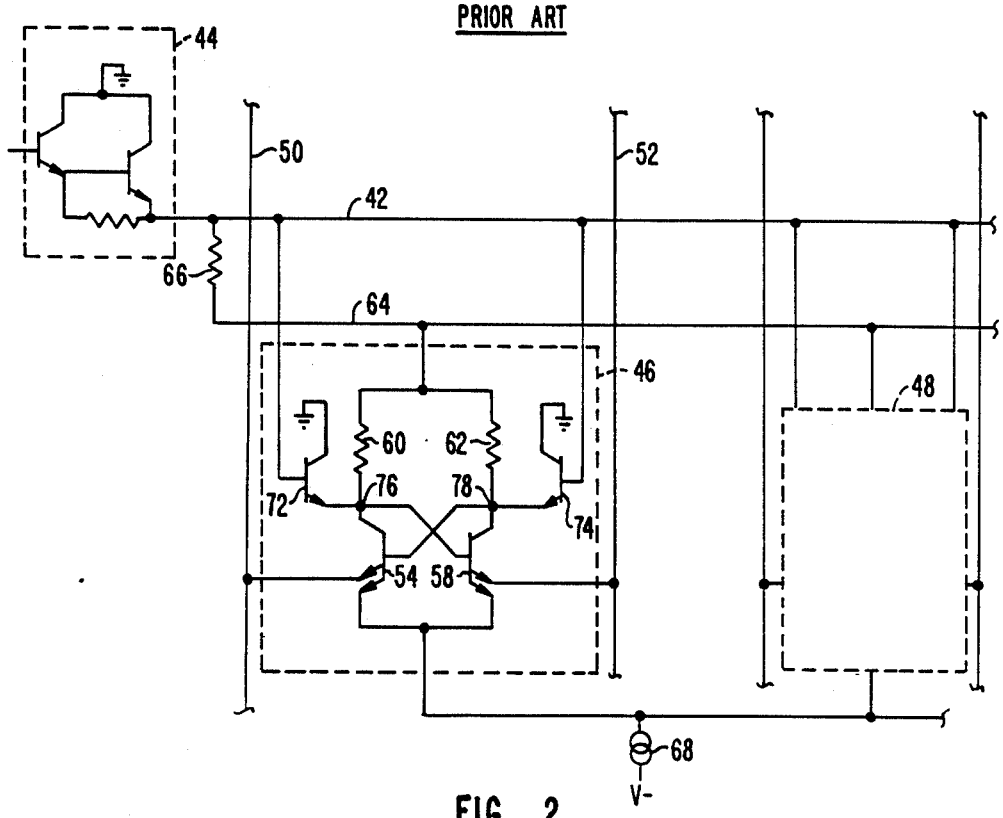
FIG._2.

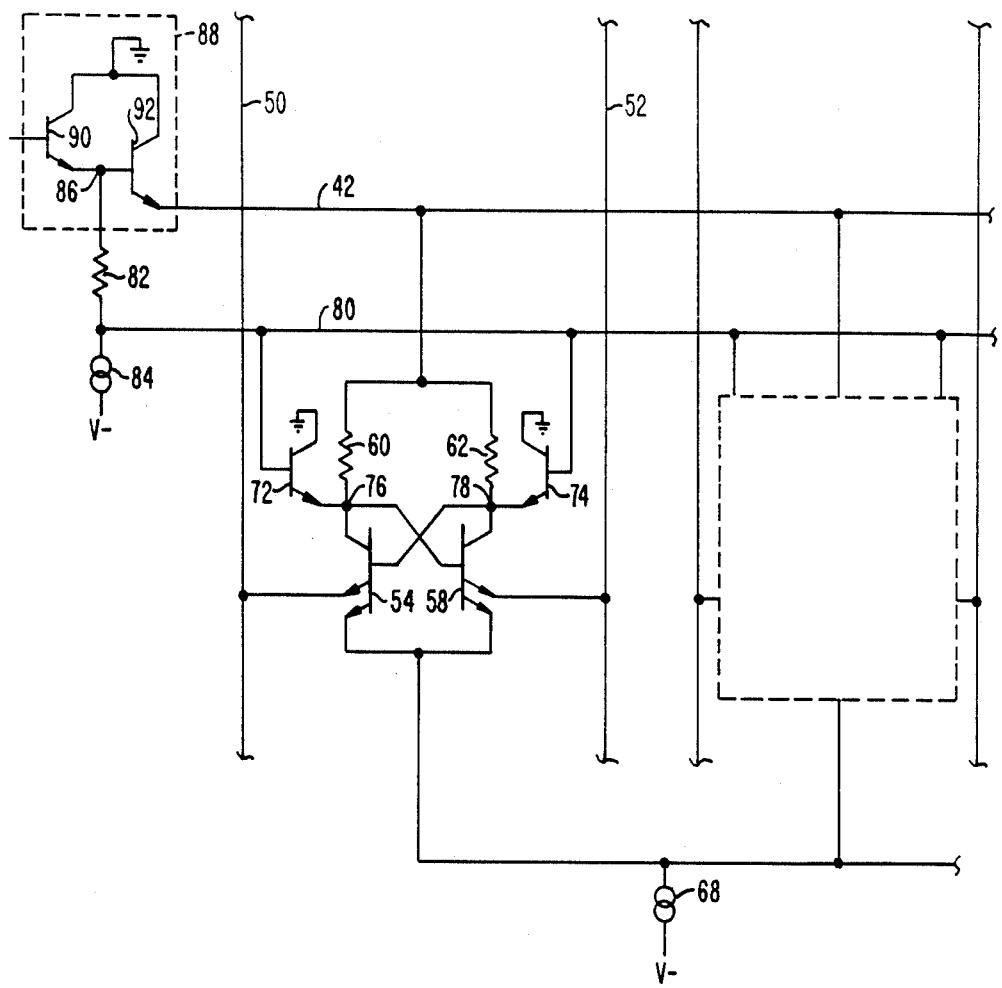
FIG._3.

VARIABLE CLAMPED MEMORY CELL

BACKGROUND

The present invention relates to static memory cells using a pair of cross-coupled NPN transistors.

A typical prior art static random access memory (RAM) memory cell is shown in FIG. 1. A word line driver circuit 10 is coupled to a word line 12 which is coupled to a plurality of memory cells of which two memory cells 14 and 16, are shown. Each memory cell coupled to a particular word line is also coupled to a different pair of bit lines. For instance, memory cell 14 is coupled to a bit line 18 and an inverse bit line 20.

Each memory cell in the array has the structure of memory cell 14. In a typical array there will be thousands of such cells. Each cell includes a pair of cross-coupled NPN transistors 22, 24 with the collector of transistor 22 coupled to the base of transistor 24 and the collector of transistor 24 coupled to the base of transistor 22. A first emitter of each of transistors 22, 24 is coupled to bit lines 18 and 20, respectively, and a second emitter is coupled to a current source 26 which provides the standby current for all the cells of a word. The collectors of transistors 22, 24 are coupled to load resistors 28, 30, respectively.

In operation, one of transistors 22, 24 is normally conducting and the other is cut-off. In the standby mode, if transistor 22 is the one conducting, its collector will be at a voltage equal to the value of load resistor 28 times the standby current below the voltage at word line 12. The base of transistor 24 will be at the same voltage. Because the emitter of transistor 24 is at the same voltage as the emitter of transistor 22, this lower base voltage results in transistor 24 being cut-off.

To read the cell, the voltage of word line 12 is raised, thus forcing more current through resistor 28 and transistor 22 and out the second emitter of transistor 22 onto bit line 18, where it is detected. In order to write into memory cell 14, bit line 18 is raised relative to the most negative supply and bit line 20 is lowered relative to the most negative supply, thereby turning on transistor 24. The voltage at the collector of transistor 24 falls, turning off transistor 22. The voltage at the collector of transistor 22 rises, pulling up the base of transistor 24, which in turn pulls up bit line 20 to reflect the opposite state of the cell.

In order to reduce the time delay required for changing the state of the cell or reading the data last written into the cell, the charge stored in the cell must be minimized. The magnitude of the charge stored in the cell is determined by the amount of forward bias across the base-collector junction of transistor 22. This is currently done by limiting the voltage drop across load resistor 28 by means of a diode 38, thereby limiting the forward bias on the collector-base junction of transistor 22. A standard diode may still have a voltage drop of approximately 800 millivolts (mV), which will still saturate the memory cell transistor, although the amount of saturation is limited. By using a Schottky diode, the voltage drop can be limited to approximately 600 millivolts, so that the memory cell transistor is only slightly saturated.

If diode 38 is formed by a relatively large junction consisting of an extended base region and buried layer, its effectiveness at limiting stored charge is determined by its area. If diode 38 is a Schottky diode, it introduces the undesirable complications of requiring the reference level that senses the state of the cell to have a Schottky dependency over temperature and manufacturing variability. This increases the manufacturing costs.

Another important design consideration is the noise margin of word line 12. A large differential between the high and low voltage levels on word line 12 is desired to increase the noise margin. The read current through the load resistors and clamping diodes will pull down the high voltage level of word line 12 when it is selected, lowering the noise margin. It is thus desirable to limit the read current.

SUMMARY OF THE INVENTION

The present invention provides an improved memory cell circuit in which the collector of the "ON" transistor is clamped to a variable voltage level to prevent saturation. This is achieved by limiting the voltage between a first node in the word line circuit and the collector of the conducting transistor to a first level, while limiting the voltage between the first node and the collector of the nonconducting transistor to a second, lower level.

By reducing the forward bias voltage on the collector-base junction of the "ON" transistor, saturation is prevented, enabling fast write recovery time. This is desirable in the implementation of high speed RAMs with equal read and write cycles.

According to a first embodiment transistors have present invention, a pair of clamping transistors have their bases coupled to the word line and their emitters coupled to the collectors of the memory cell transistors. The collectors are coupled to Vcc (ground). A common resistor is provided between the word line and the load resistors of the memory cell. The clamping transistors limit the voltage at the collector of the "ON" transistor, while the common resistor provides a voltage divider with the load resistors of the memory cells to limit the voltage at the collector of the nonconducting transistor to an intermediate value. A single common resistor is used for all the memory cells connected to a common word line.

In an alternate embodiment, the clamping transistors have their bases coupled to one lead of a common resistor which has its other lead coupled between the transistors of a Darlington driver for the word line. The load resistors of the memory cell are coupled directly to the word line. In this embodiment, the clamping transistors hold the collector of the conducting transistor to a voltage defined by the base-emitter voltage drop of the clamping transistor and the voltage drop across the common resistor. The intermediate voltage for the collector of the nonconducting transistor is set by the base-emitter voltage drop of the second transistor of the Darlington driver. This embodiment additionally has a current source coupled to the common resistor to provide the additional current needed due to the coupling of the clamping transistors to the first transistor of the Darlington driver.

The use of NPN transistors for clamping, rather than Schottky diodes as in the prior art, eliminates the need for two additional masking steps and requires less area on a semiconductor chip. By connecting the collector of the clamping transistor to Vcc (ground), AC and DC loading are reduced. AC loading is reduced because the collector connection to ground shorts the parasitic substrate capacitance. DC loading is reduced because the clamping transistor can now supply the majority of the read current. This allows smaller devices to be used for the word line driver, reducing its area and parasitic capacitances.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a schematic diagram of a prior art memory cell circuit;

FIG. 2 is a schematic diagram of a first embodiment of a memory cell circuit according to the present invention; and FIG. 3 is a schematic diagram of a second embodiment of a memory cell circuit according to the present invention.

DETAILED DESCRIPTION OF THE PREFERRED EMBODIMENTS

FIG. 2 is a circuit schematic of a first embodiment of a memory cell circuit according to the present invention. A word line 42 is driven by a Darlington driver 44 and is coupled to a plurality of memory cells, of which memory cells 46 and 48 are shown. Memory cell 46 is also coupled to a bit line 50 and its inverse, bit line 52. Bit lines 50 and 52 provide the indication of whether a 1 or a 0 is stored in memory cell 46 for the word associated with word line 42. In a complete memory circuit, there are a plurality of word lines intersected by a plurality of bit line pairs, each with cells as illustrated.

Memory cell 46 has a pair of cross-coupled transistors 54, 58 which have associated load resistors 60, 62, respectively. Instead of load resistors 60, 62 being coupled to word line 42 as in the prior art, they are instead coupled to a line 64 which is itself coupled to word line 42 through a common resistor 66.

A current source 68 provides the current to one emitter of transistors 54 and 58, while the other emitter of transistors 54, 58 is coupled to bit lines 50 and 52, respectively. Clamping transistors 72, 74 are provided with their bases coupled to word line 42 and their collectors coupled to ground. The emitters of transistors 72 and 74 are coupled to the collectors of transistors 54, 58, respectively.

In operation, if transistor 54 is on, clamping transistor 72 will limit the voltage at the collector of transistor 54, node 76, to a first voltage level (V1). Because current is flowing through resistor 60, the voltage at line 64 will be at a second voltage level (V2). The voltage at line 42 (V3) is equal to V2 plus the voltage drop across resistor 66. V2 is equivalent to the voltage drop through the transistor 72 base-emitter junction, as divided by resistors 66 and 60, below V3. Because no current is flowing through resistor 62, the collector of transistor 58, node 78, is at this lower voltage (V2) of line 64. Thus, since node 78 is coupled to the base of transistor 54, the forward base-collector voltage for transistor 54 can be limited to less than the voltage necessary for the onset of saturation. This is accomplished by choosing the appropriate value for common resistor 66.

Since a plurality of memory cells are coupled to line 64, the value of common resistor 66 is chosen to be approximately equal to the parallel combination of a load resistor (either 60 or 62) and an equivalent load resistor in the remaining memory cells coupled to line 64. The value used for resistor 66 can be simply calculated as the value of a single load resistor (60) divided by one-half the number of load resistors coupled to line 64. Thus, for example, if there is a 0.8 volt voltage drop across the base-emitter junction of transistor 72, the voltage drop across resistor 66 will be 0.4 volts, thus resulting in a 0.4 volt forward voltage across the base-collector junction of transistor 54.

By connecting the collector node of clamping transistors 72 and 74 to ground, a speed improvement is achieved. This ground connection serves to ground, or short-circuit, the substrate capacitance present at the collector of transistors 72 and 74. In addition, by connecting the collector of clamp transistors 72 and 74 to ground, these collectors can provide most of the read current for memory cell 46, thus reducing the amount of current which must be provided by driver 44. This arrangement permits the use of smaller devices for driver 44, thereby reducing the area required for the driver and reducing parasitic capacitances. This results in an improvement in performance.

Clamping transistors 72 and 74 thus reduce AC capacitive loading by grounding their collectors. DC loading is reduced since the collector is connected to Vcc, or ground, and thus can provide the required DC read current, or at least a majority of the DC read current. By reducing the loading of word driver 44, the noise margin of the circuit is improved.

An alternate embodiment of the present invention is shown in FIG. 3. As in FIG. 2, a pair of transistors 54, 58 are provided with associated load resistors 60, 62 and clamping transistors 72, 74. However, resistors 60 and 62 are coupled directly to word line 42 while the bases of clamping transistors 72 and 74 are coupled to a line 80 which is coupled to a common resistor 82. Resistor 82 is coupled between a current source 84 and a node 86. Node 86 is an intermediate node in a word driver 88 where the emitter of a transistor 90 is coupled to the base of a transistor 92.

In this embodiment, if transistor 54 is on, the voltage at node 76 is determined by the voltage drop through common resistor 82 and the base-emitter voltage of transistor 72. Node 78 will be at the voltage level of word line 42 since no current flows through resistor 62. The line 42 voltage will be lower than the voltage at node 86 by the base-emitter voltage drop of transistor 92. Thus, this voltage drop will be less than the voltage drop to node 76 by the amount of the voltage drop through common resistor 82. Because resistor 82 draws current from Darlington driver 88, a current source 84 is required to provide the additional current.

As in FIG. 2, a plurality of memory cells are coupled to word line 42 and line 80 in the same manner as shown. The value for resistor 82 is preferably chosen to give a voltage drop across resistor 82 of approximately half the base-emitter junction voltage of transistor 92. If the base-emitter junction voltage of transistor 92 is 800 millivolts, for example, this will result in a 400 millivolt differential between node 76 and the base of transistor 54, thus preventing transistor 54 from going into saturation in the "ON" state.

As will be understood by those familiar with the art, the present invention may be embodied in other specific forms without departing from the spirit or essential characteristics thereof. For example, a diode could be used in place of transistors 72 and 74 of FIGS. 2 and 3, respectively. Alternately, a driver other than the Darlington driver could be used in FIG. 3, with common resistor 82 being coupled to an intermediate node. PNP transistors could be used for the memory cell using an inverted structure if PNP transistors with the proper size and speed are developed. Accordingly, the disclosure of the preferred embodiments of the invention is intended to be illustrative, but not limiting, of the scope of the invention which is set forth in the following claims.

We claim:

1. In a memory circuit having a plurality of memory cells, each memory cell having a pair of transistors, a collector of a first transistor being coupled to a base of a second transistor and a collector of said second transistor being coupled to a base of said first transistor, each of said first and second transistors having an emitter coupled to a different bit line, a first load resistor coupling said collector of said first transistor to a word line and a second load resistor coupling said collector of said second transistor to said word line, said word line being part of a word line circuit including a word line driver, the improvement comprising:

first means for limiting a voltage between a first node in said word line circuit and said collector of a substantially conducting one of said first and second transistors to a first level; and second means for limiting a voltage between said first node and said collector of a substantially nonconducting one of said frist and second transistors to a second level lower than said first level.

2. The circuit of claim 1 wherein said first means comprises third and fourth transistors having bases coupled to said word line and emitters coupled to said collectors of said first and second transistors, respectively, and said second means comprises a common resistor coupling said word line to said first and second load resistors.

3. The circuit of claim 2 wherein the collectors of said third and fourth transistors are coupled to ground.

4. The circuit of claim 2 wherein said common resistor is coupled to a plurality of load resistors in a plurality of memory cells forming a word.

5. The circuit of claim 4 wherein the value of said common resistor is substantially equal to the value of the parallel combination of one-half of said plurality of load resistors in said word.

6. The circuit of claim 1 wherein said word line driver comprises a third transistor having an emitter coupled to said word line and a fourth transistor having an emitter coupled at said first node to a base of said third transistor, said first means comprises a third resistor coupled at a first lead to said first node and fifth and sixth clamping transistors having bases coupled to a second lead of said common resistor and emitters coupled to said collectors of said first and second transistors, respectively, and said second means comprises a base-emitter junction of said third transistor in said line driver.

7. The circuit of claim 6 further comprising a current source coupled to said second lead of said common resistor.

8. The circuit of claim 6 wherein the collectors of said fifth and sixth transistors are coupled to ground.

9. The circuit of claim 6 wherein said second lead of said common resistor is coupled to a plurality of clamping transistors in a plurality of memory cells forming a word.

10. In a memory circuit having a plurality of memory cells coupled to a word line, each memory cell having a pair of transistors, a collector of a first transistor being coupled to a base of a second transistor and a collector of said second transistor being coupled to a base of said first transistor, each of said first and second transistors having an emitter coupled to a different bit line, the improvement comprising:

means, coupled between said word line and said collectors of said first and second transistors, for limiting a voltage between said word line and the collector of a substantially conducting one of said first and second transistors to a first voltage level; and means, coupled between said word line and said collectors of said first and second transistors, for providing an intermediate voltage level to the collector of a substantially nonconducting one of said first and second transistors.

11. In a memory circuit having a plurality of memory cells, each memory cell having a pair of transistors, a collector of a first transistor being coupled to a base of a second transistor and a collector of said second transistor being coupled to a base of said first transistor, each of said first and second transistors having an emitter coupled to a different bit line, a first load resistor coupled to said collector of said first transistor and a second load resistor coupled t o said collector of said second transistor, the improvement comprising:

third and fourth transistors having bases coupled to a word line, collectros coupled to ground and emitters coupled to said collectors of said first and second transistors, respectively; and a common resistor coupling said word line to said first and second load resistors and to a plurality of load resistors in a plurality of memory cells.

12. In am memory circuit having a plurality of memory cells, each memory cell having a pair of transistors, a collector of a first transistor being coupled to a base of a second transistor and a collector of said second transistor being coupled to a base of said first transistor, each of said first and second transistors having an emitter coupled to a different bit line, a first load resistor coupling said collector of said first transistor to a word and a second load resistor coupling said collector of said second transistor to said word line, said word line being part of a word line circuit including a word line driver, said word line driver having a third transistor with an emitter coupled to said word line and a fourth transistor with an emitter coupled to a base of said third transistor, the improvement comprising:

a common resistor having a first lead coupled to said emitter of said fourth transistor;

a current source coupled to a second lead of said common resistor; and fifth and sixth clamplling transistors having bases coupled to said second lead of said common resistor, collectors coupled to ground and emitters coupled to said collectors of said first and second transistors, respectively.

13. The circuit of claim 12 further comprising a plurality of clamping transistors in said plurality of memory cells having bases coupled to said second lead of said common resistor.

* * * * *